(12) United States Patent
Ogasawara

(10) Patent No.: US 7,372,932 B2
(45) Date of Patent: May 13, 2008

(54) LOCKING-STATUS JUDGING CIRCUIT FOR DIGITAL PLL CIRCUIT

(75) Inventor: Jin Ogasawara, Machida (JP)

(73) Assignee: Victor Company of Japan, Limited, Yokohama (JP)

( * ) Notice: Subject to any disclaimer, the term of this patent is extended or adjusted under 35 U.S.C. 154(b) by 520 days.

(21) Appl. No.: 11/091,530

(22) Filed: Mar. 29, 2005

(65) Prior Publication Data

US 2005/0220242 A1   Oct. 6, 2005

(30) Foreign Application Priority Data

Mar. 31, 2004   (JP)   ............................. 2004-102834
Feb. 24, 2005   (JP)   ............................. 2005-048453

(51) Int. Cl.
*H03D 3/24* (2006.01)
*H03L 7/06* (2006.01)

(52) U.S. Cl. ........................ 375/376; 375/373; 327/156

(58) Field of Classification Search ................ 375/376, 375/373; 327/156
See application file for complete search history.

(56) References Cited

U.S. PATENT DOCUMENTS 5,740,205 A * 4/1998 Baum et al. ................. 375/344

6,803,828 B2 * 10/2004 Tan et al. ...................... 331/17
6,912,012 B2 * 6/2005 Renner et al. ............... 348/536
2002/0061087 A1 * 5/2002 Williams ..................... 375/376
2007/0164835 A1 * 7/2007 Co .............................. 332/144

FOREIGN PATENT DOCUMENTS

JP           3028955 B1       4/2000
JP        2002-358739 A      12/2002

* cited by examiner

*Primary Examiner*—Shuwang Liu
*Assistant Examiner*—David Huang
(74) *Attorney, Agent, or Firm*—Connolly Bove Lodge & Hutz LLP

(57) ABSTRACT

A locking-status judging circuit is composed of a comparator that compares a phase error signal with a reference signal for judging whether or not a digital PLL circuit locks on an input signal and outputs a signal "0 (zero)" or a signal "1 (one)", a selector that outputs a positive or negative number in response to the inputted signal whether it is "0" or "1", a limiter that limits an accumulated number to be within a range of prescribed upper and lower limits, a feedback section that returns the accumulated number, an accumulator that adds the accumulated number and a positive or negative number from the selector and outputs a newly accumulated number, and a lock-state judging section that judges the digital PLL circuit whether it is in a lock-state or an unlock-state in response to an accumulated value of the newly accumulated number whether it is positive or negative.

2 Claims, 10 Drawing Sheets

LOCKING-STATUS JUDGING CIRCUIT FOR DIGITAL PLL CIRCUIT

BACKGROUND OF THE INVENTION

1. Field of the Invention

The present invention relates to a locking-status judging circuit for a digital PLL (Phase Locked Loop) circuit, which judges whether or not the digital PLL circuit locks on an input signal.

2. Description of the Related Art

Recently, an optical disc, which is recorded with an information signal such as a video signal and an audio signal, has been introduced into markets, wherein the information signal is converted into a digital signal, compressed, encoded and modulated digitally. When reproducing such an optical disc, the digitally modulated signal that is recorded in the optical disc is read out, and a clock signal for decoding the digitally modulated signal is extracted. By using the extracted clock signal, the digitally modulated signal is demodulated, and then the compression encoded information signal is decoded. In other words, a clock signal is generated by inputting a signal that is reproduced from an optical disc into a digital PLL (Phase Locked Loop) circuit. Then, by using the clock signal, an information signal that is recorded in the optical disc is reproduced.

In this connection, if a lock-state detector circuit enables to detect immediately a status of the digital PLL circuit whether the digital PLL circuit is in synchronism with an input signal, that is, in a lock-state or out of synchronization, that is, in an unlock-state, the digital PLL circuit enables to be advanced to the lock-state by increasing a loop gain of the digital PLL circuit in case of the unlock-state. On the contrary, in case of the lock-state, by reducing the loop gain of the digital PLL circuit, the digital PLL circuit enables to be hardly affected by a noise signal component to be possibly inputted and enables to obtain a clock signal of which frequency is stable. Consequently, an optical disc reproducing apparatus, which enables to start to reproduce an information signal recorded in an optical disc immediately, enables to be realized.

Further, the optical disc reproducing apparatus enables to reproduce a signal to be demodulated in higher stability although the signal contains excessive phase fluctuation components.

With referring to a drawing, operations of a PLL circuit are depicted.

FIG. 10 is a block diagram of a conventional PLL circuit provided with a lock-state detecting section according to the prior art.

As shown in FIG. 10, a conventional PLL circuit having a lock-state detector function is composed of a PLL section 8 and a lock-state detecting section 9. The PLL section 8 is further composed of a phase comparator circuit 81, a loop filter 82, and a voltage controlled oscillator 83. The lock-state detecting section 9 is further composed of a phase difference detector circuit 91 and a lock-state detector circuit 92.

An input signal having a noise component and a phase fluctuation component is supplied to one input terminal of the phase comparator circuit 81 and the phase difference detector circuit 91 respectively. The other input terminal of the phase comparator circuit 81 and the phase difference detector circuit 91 is respectively supplied with an oscillator output signal that is generated by the voltage controlled oscillator 83.

The phase comparator circuit 81 detects a phase difference between the input signal and the oscillator output signal outputted from the voltage controlled oscillator 83, and results in outputting an error signal based on the phase difference. The error signal is inputted into the loop filter 82, and a low frequency component of the error signal is boosted through an accumulation process therein. The error signal of which low frequency component is boosted by the loop filter 82 is inputted into the voltage controlled oscillator 83.

The voltage controlled oscillator 83 oscillates at a frequency in response to the inputted error signal and outputs an oscillator output signal. Then, a clock signal for driving other digital circuit (not shown) such as a demodulator circuit for a digitally modulated signal and a decoder circuit for a compression encoded signal is generated by using the oscillator output signal.

The phase difference detector circuit 91 detects a phase difference between the inputted two signals, the input signal and the oscillator output signal through the synchronous detection. In other words, the phase difference detector circuit 91 outputs a phase error signal in low level in case the conventional PLL circuit locks on the input signal. On the contrary, in case the conventional PLL circuit does not lock on the input signal or the input signal contains excessive noise components and excessive phase fluctuation components, the phase difference detector circuit 91 outputs a phase error signal in high level.

The lock-state detector circuit 92 compares an absolute value of the phase error signal with a prescribed reference value, and detects a status of the conventional PLL circuit. The status of the conventional PLL circuit is detected as the unlock-state in case the absolute value of the phase error signal is larger than the prescribed reference value.

An optical disc reproducing apparatus installed with the PLL section 8 and the lock-state detecting section 9 conducts to demodulate a reproduced digitally modulated signal and decodes a compression encoded information signal on the basis of the detected signal in the lock-state.

The Japanese publication of unexamined patent applications No. 2002-358739 discloses that detecting the unlock-state of the PLL circuit is realized by detecting a phase error signal such that an average of phase error signals in the prescribed time period exceeds the predetermined value, wherein the phase error signal is the output signal from the phase comparator of the PLL circuit. Unstableness of phase synchronism in the PLL circuit enables to be detected by detecting the unlock-state of the PLL circuit. By detecting a status of phase synchronism in the PLL circuit, the circuit operation in the error correction section is stopped when unstableness is detected. Consequently, the optical disc reproducing apparatus in which power consumption of the circuit is reduced is realized.

Further, the Japanese Patent No. 3028955 discloses the method of detecting a lock-state in the PLL locking circuit. According to the Japanese Patent No. 3028955, by comparing a phase error signal with the prescribed reference value, the PLL locking circuit outputs a phase error signal, which is utilized for judging whether the PLL circuit is in the lock-state or not, only when a phase error signal falls below the prescribed reference value continuously a plurality of times that exceeds the prescribed number of times.

However, according to the method of reproducing data disclosed in the Japanese publication of unexamined patent applications No. 2002-358739, it is hardly discriminated whether a phase error signal in higher level to be detected is generated on the basis of a signal having a short inversion interval or the phase error signal is generated by the PLL circuit that is in the unlock-state, in case a signal having large phase fluctuation such as a signal having a short inversion interval is inputted into the reproducing apparatus although the PLL circuit is in the lock-state when reproducing an optical disc. Particularly, it is hard to discriminate the distinction when a higher frequency range of the signal to be inputted is attenuated due to deterioration of transfer characteristics that occurs in a process from recording to reproducing.

Further, in case loop gain of the PLL circuit is increased to compensate the attenuated high frequency component so as to shift the PLL circuit from the unlock-state to the lock-state, it is difficult to discriminate whether a phase error signal that is detected by the phase difference detector circuit 91 is generated on the basis of phase fluctuation of the signal to be inputted or the phase error signal is generated by the PLL circuit that is in the unlock-state.

Furthermore, with respect to the method of detecting the lock and unlock states disclosed in the Japanese Patent No. 3028955, further details are given to a specific case in which an input signal to be detected whether it is in the lock-state or the unlock-state is obtained by reproducing a n optical disc.

When reproducing an optical disc, an input signal having a long inversion interval is hardly affected by deterioration of transfer characteristics, so that a PLL circuit easily locks on the input signal, and discriminating the lock-state is also easy. However, in case of an input signal having a short inversion interval, the input signal is easily affected by deterioration of transfer characteristics in a higher frequency range, and resulting in detecting phase error larger due to enhancing high frequency range so as to compensate the deterioration of the high frequency range. Consequently, phase error exceeding a reference value is often detected. On the other hand, in case of a signal having a short inversion interval, such a signal is often contained in the input signal at random. Therefore, when a signal having a short inversion interval is inputted into the PLL circuit in succession, the locking status of the PLL circuit might be detected as the unlock-state although the PLL circuit locks on the input signal. In other words, the method of judging the locking status of the PLL circuit disclosed in the Japanese Patent No. 3028955 sometimes misjudges.

SUMMARY OF THE INVENTION

Accordingly, in consideration of the above-mentioned problems of the prior arts, an object of the present invention is to provide a locking-status judging circuit for a digital PLL circuit, wherein the digital PLL circuit generates an oscillator output signal having a frequency of which phase is synchronized with an input signal that is randomly mixed with a signal, which contains phase error components in high level and is short in inversion interval, and another signal, which is long in inversion interval and small in phase error component.

Further, the locking-status judging circuit enables to judge a locking status of the digital PLL circuit appropriately without any error and enables to judge whether the digital PLL circuit is in the lock-state or the unlock-state immediately.

In order to achieve the above object, the present invention provides, according to an aspect thereof, a locking-status judging circuit for a digital PLL circuit, judging whether or not the digital PLL circuit locks on an input signal, comprising: a comparator for comparing a phase error signal outputted from the digital PLL circuit with a reference signal to be utilized for judging whether or not the digital PLL circuit locks on an input signal, and for outputting a signal "0 (zero)" in case the reference signal is larger than the phase error signal or a signal "1 (one)" in case the reference signal is smaller than the phase error signal; a selector section for outputting a positive number in case the signal "0" is inputted or a negative number in case the signal "1" is inputted; a limiter section for limiting an accumulated positive or negative number to be within a range of a prescribed upper limit and a prescribed lower limit; a feedback section for returning the accumulated positive or negative number within the range of the prescribed upper limit and the prescribed lower limit; an accumulator for adding the accumulated positive or negative number, returned from the feedback section, and either one of a positive number and a negative number, outputted from the selector section, and for outputting a newly accumulated positive or negative number obtained by adding the accumulated positive or a negative number and either one of a positive number or negative number; and a lock-state judging section for judging the digital PLL circuit as a lock-state in case an accumulated value of the newly accumulated positive or negative number is positive, or as an unlock-state in case the accumulated value of the newly accumulated positive or negative number is negative.

Other object and further features of the present invention will be apparent from the following detailed description when read in conjunction with the accompanying drawings.

DETAILED DESCRIPTION OF THE PREFERRED EMBODIMENTS

Prior to describing preferred embodiments of the present invention, operations and circuitry common to the preferred embodiments are explained first.

Figure 1:
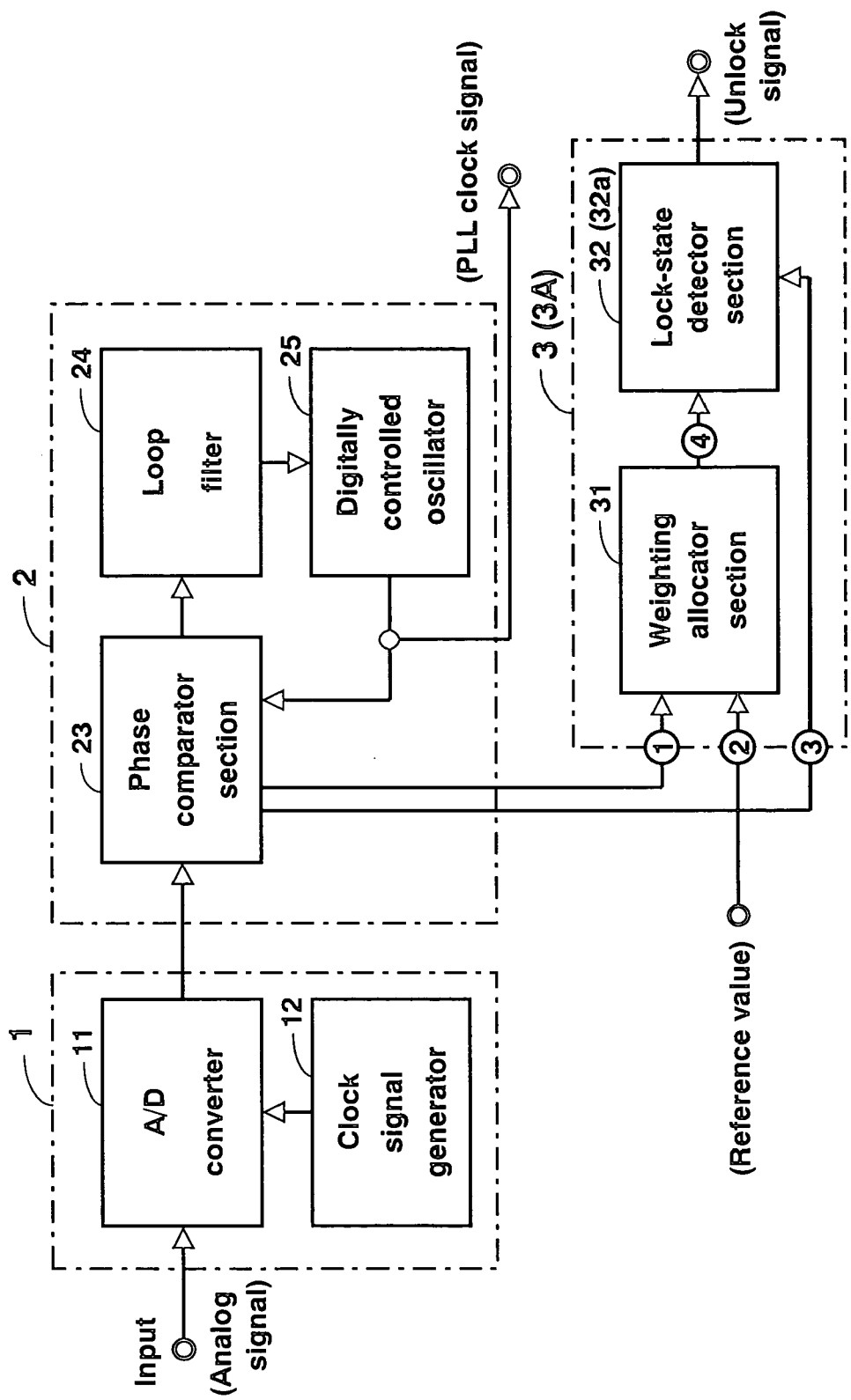
FIG. 1 is a block diagram of a digital PLL device provided with a locking-status judging circuit according to embodiments of the present invention together with an input circuit section.

FIG. 1 is a block diagram of a digital PLL device provided with a locking-status judging circuit according to embodiments of the present invention together with an input circuit section.

Figure 2:
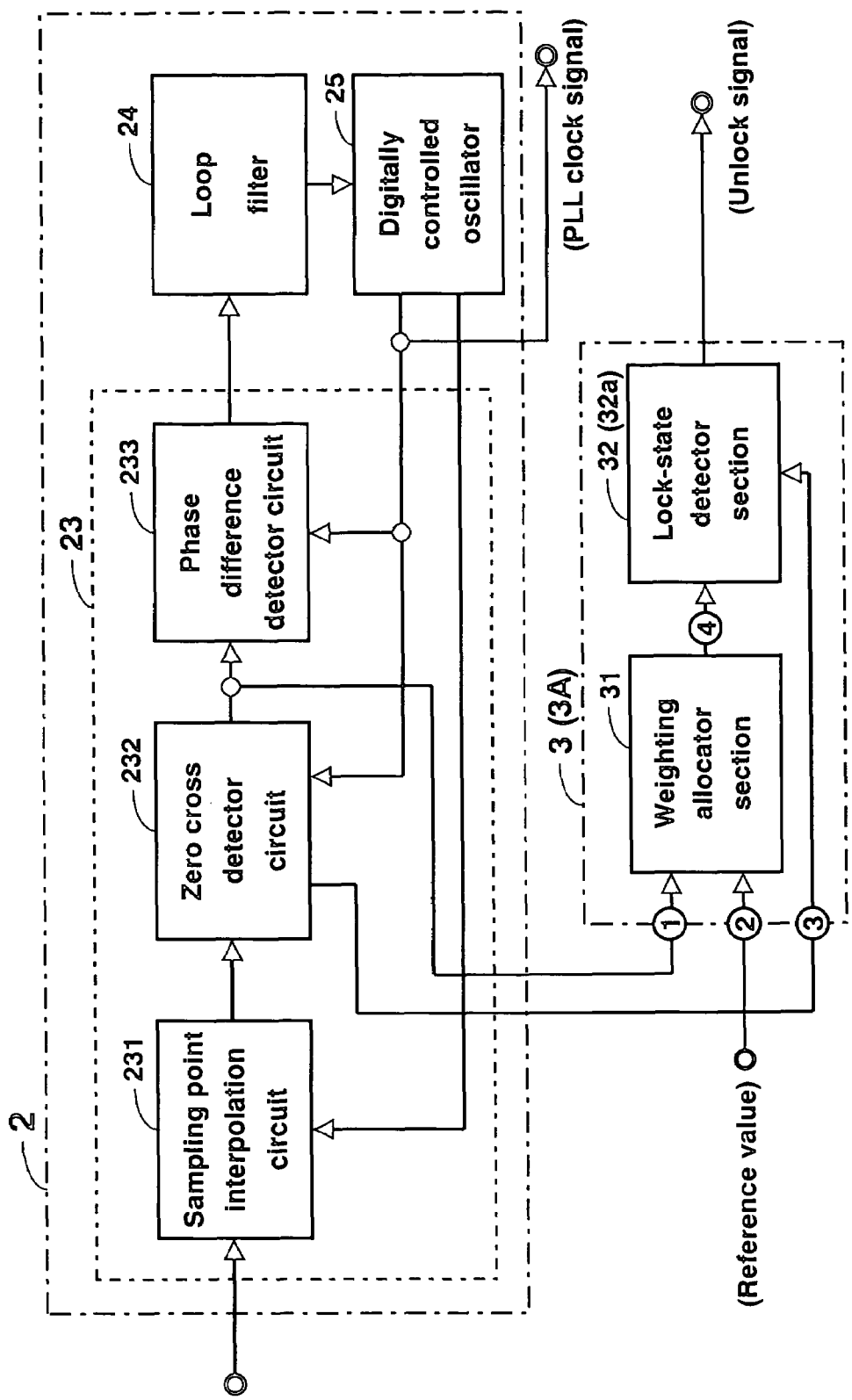
FIG. 2 is a block diagram detailing the digital PLL circuit shown in FIG. 1 for explaining zero cross data.

FIG. 2 is a block diagram detailing the digital PLL circuit shown in FIG. 1 for explaining zero cross data.

Figure 3:
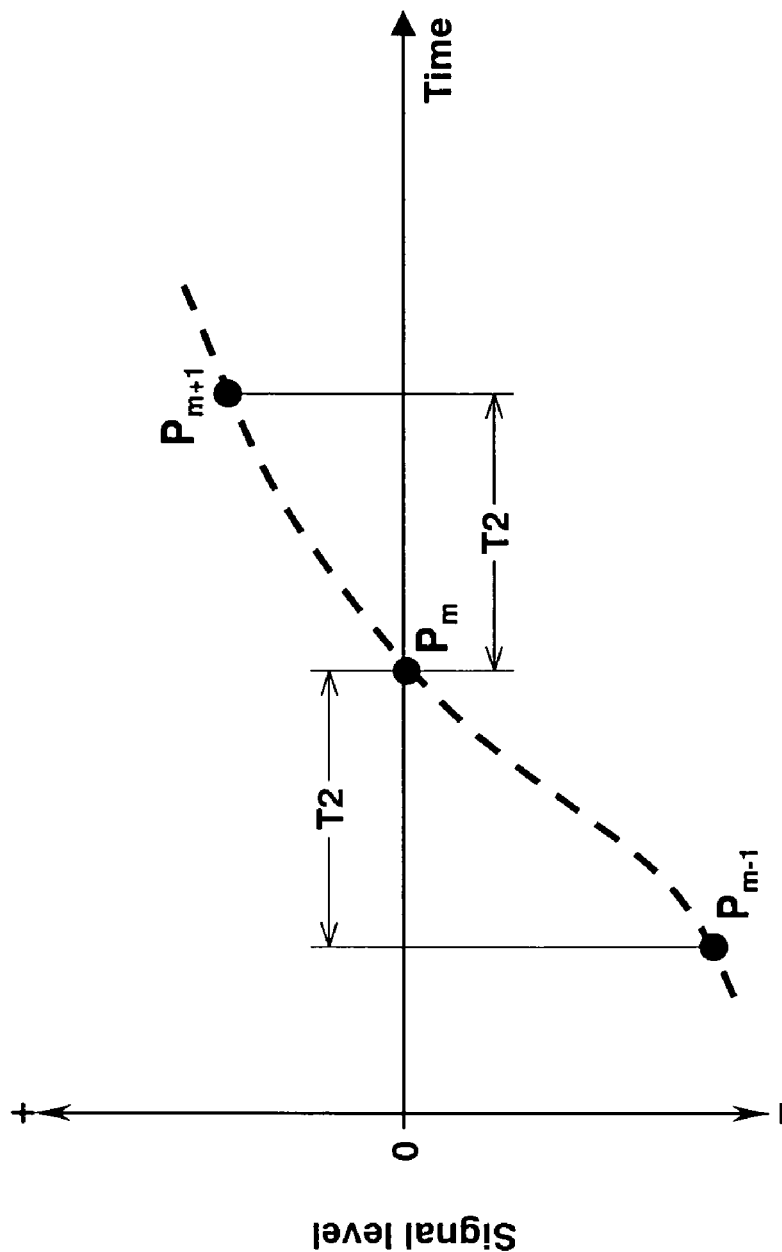
FIG. 3 shows discrete data of an input signal that is re-sampled by the PLL clock signal, wherein one of sampling points coincides with a zero cross sampling point.

FIG. 3 shows discrete data of an input signal that is re-sampled by the PLL clock signal, wherein one of sampling points coincides with a zero cross sampling point.

Figure 4:
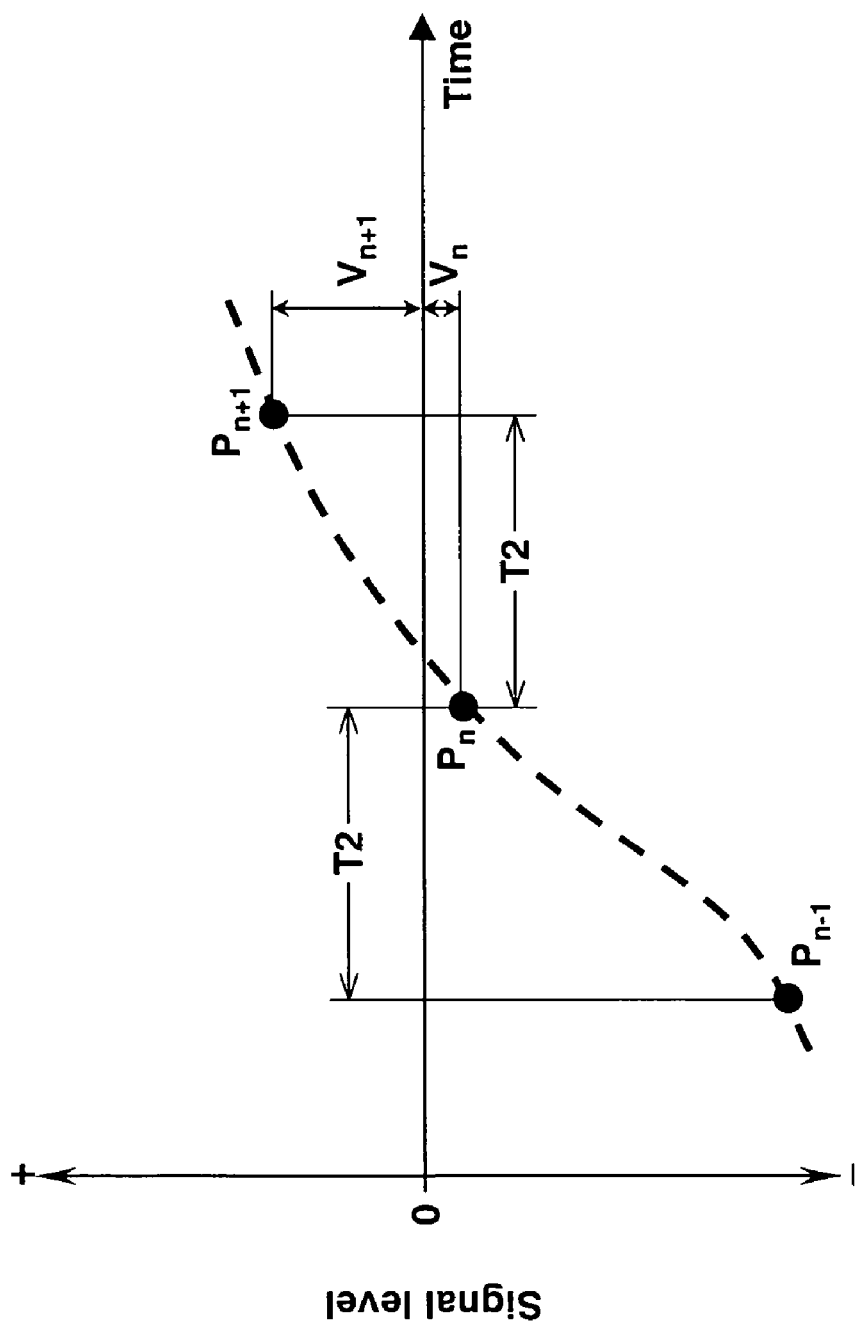
FIG. 4 shows discrete data of an input signal re-sampled by the PLL clock signal, wherein a sampling point slightly departs from the zero cross sampling point.

FIG. 4 shows discrete data of an input signal re-sampled by the PLL clock signal, wherein a sampling point slightly departs from the zero cross sampling point.

Figure 5:
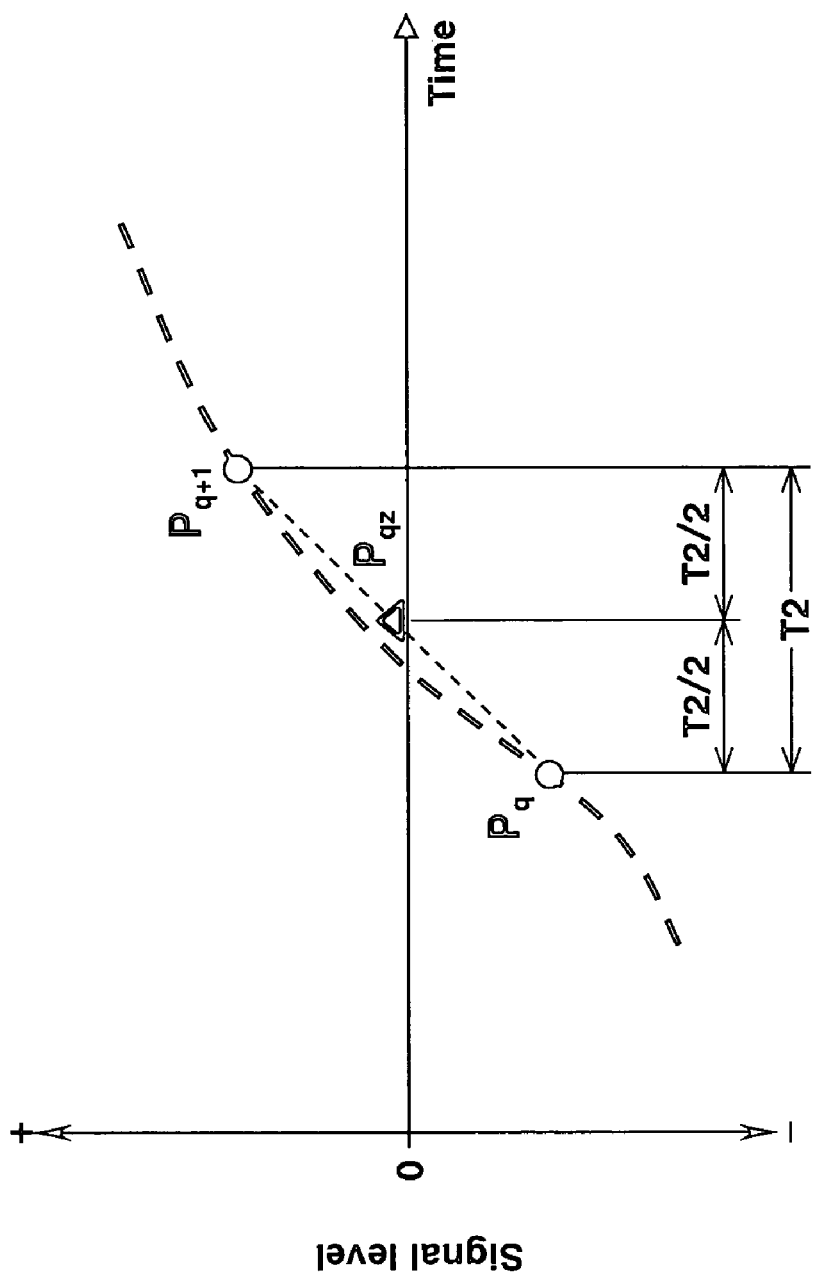
FIG. 5 shows discrete data of an input signal that is re-sampled by the PLL clock signal, wherein each sampling point does not coincide with the zero cross sampling point.

FIG. 5 shows discrete data of an input signal that is re-sampled by the PLL clock signal, wherein each sampling point does not coincide with the zero cross sampling point.

In FIG. 1, a digital PLL device is composed of a conventional input circuit section 1, a digital PLL circuit 2 and a locking-status judging circuit 3. The conventional input circuit section 1 is further composed of an A/D (analog to digital) converter 11 and a clock signal generator 12. The digital PLL circuit 2 is further composed of a phase comparator section 23, a loop filter 24, and a digitally controlled oscillator 25. The locking-status judging circuit 3 to be detailed later is composed of a weighting allocator section 31 and a lock-state detector section 32.

In FIG. 2, the phase comparator section 23 is further composed of a sampling point interpolation circuit 231, a zero cross detector circuit 232, and a phase difference detector circuit 233.

With referring to FIGS. 1 and 2, operations in the conventional input circuit section 1, the digital PLL circuit 2, and the locking-status judging circuit 3 are explained briefly.

An input signal having a long inversion interval or another input signal having a short inversion interval and containing a phase fluctuation component is inputted into the A/D converter 11 of the input circuit section 1, wherein those input signals are obtained by reproducing a not shown optical disc or like.

In the A/D converter 11, the input signal is sampled by a sampling clock signal that is outputted from the clock signal generator 12, and results in being digitized, wherein the sampling clock signal is not in synchronism with a PLL clock signal that is in relation of an oscillation frequency of the digitally controlled oscillator 25 of the digital PLL circuit 2.

The digitized input signal is inputted into the sampling point interpolation circuit 231 of the phase comparator section 23 together with interpolation phase information (to be detailed later), and re-sampled (to be detailed later) therein, wherein interpolation phase information is in relation of an oscillation frequency that is generated in the digitally controlled oscillator 25 and outputted therefrom.

An error signal in relation to phase error between the digitized input signal and the oscillation frequency is generated in accordance with a value of a sampling point obtained by the re-sampling. A high frequency component of the error signal is eliminated in the loop filter 24.

In the digitally controlled oscillator 25, the interpolation phase information is generated in response to the error signal of which high frequency component is eliminated.

Re-sampling is an operation with respect to the digitized input signal. A re-sampling operation is described briefly hereupon. A re-sampling operation is such that a digitized input signal, which is sampled by the sampling clock signal generated in the clock signal generator 12 and supplied to the phase comparator section 23, is sampled once again, that is, re-sampled by the PLL clock signal generated in the digitally controlled oscillator 25 and results in obtaining a re-sampled value. In other words, a re-sampling operation is obtaining a re-sampled value of an input signal by using the above-mentioned interpolation phase information.

Obtaining a re-sampled value is conducted by a linear interpolation method or an interpolation of higher degree method. In case of the interpolation of higher degree method, there exists several methods such as a method of obtaining an approximate value by using a function of higher degree and another method of combining a window function with an interpolation function of (sine X)/X.

The phase comparator section 23 outputs a phase error signal, which is in relation of the digital PLL circuit 2 whether the phase comparator section 23 locks on the digitized input signal (lock-state) or does not (unlock-state), in response to phase difference between the phase of the digitized input signal and the interpolation phase information. The phase error signal is inputted into the weighting allocator section. 31 of the locking-status judging circuit 3 through an input terminal ①.

In case the digital PLL circuit 2 locks on an input signal having a long inversion interval, that is, the digital PLL circuit 2 is in the lock-state, the phase error signal is outputted as a signal in low voltage. On the contrary, in case the digital PLL circuit 2 is in the unlock-state, the phase error signal is outputted as a signal in high voltage.

On the other hand, with respect to an input signal having a short inversion interval, a phase error signal in higher voltage is outputted when the digital PLL circuit 2 is in the unlock-state in comparison with the lock-state. However, voltage difference between a phase error signal of the lock-state and another phase error signal of the unlock-state is small. In other words, a phase error signal is apt to contain error in judgement between the lock-state and the unlock-state with respect to an input signal having a short inversion interval.

Further, in case an input signal contains more phase fluctuation components, a phase error signal in high voltage is possibly outputted although the digital PLL circuit 2 is in the lock-state. The locking-status judging circuit 3 enables to judge the lock-state of the digital PLL circuit 2 accurately by applying a predetermined signal processing to a phase error signal.

A locking-status of the digital PLL circuit 2 enables to be judged by the locking-status judging circuit 3 in a prescribed time period. Consequently, response speed for locking on an input signal enables to be accelerated by increasing loop gain of the digital PLL circuit 2 while the digital PLL circuit 2 is in the unlock-state.

Further, in case the digital PLL circuit 2 is in the lock-state, the flywheel effect enables to be enhanced by reducing the loop gain, and resulting in obtaining a clock signal that is hardly affected by interference caused by phase fluctuation components and noise signal components to be inputted and is stable in frequency.

The above-mentioned interpolation phase information is such information that exhibits phase difference between a oscillation frequency of the PLL clock signal generated in the digitally controlled oscillator 25 and the sampling clock signal generated in the clock signal generator 12. The digitally controlled oscillator 25 is a virtual oscillator, so that phase of the oscillation frequency is outputted as interpolation phase information that is in relation of phase difference from a signal generated in the clock signal generator 12.

In the phase comparator section 23, phase error differing from the digitized input signal inputted into the phase comparator section 23 is calculated on the basis of the inputted interpolation phase information. In this connection, the digital PLL circuit 2 conducts an oscillation frequency of the virtual oscillator to be in synchronism with the phase of the digitized input signal.

Referring back to FIG. 2, in the zero cross detector circuit 232, zero-level crossing (hereinafter referred to as zero cross) condition of the digitized input signal, which is re-sampled by the PLL clock signal (hereinafter referred to as re-sampled input signal), is detected. Actually, a value of a sampling point that crosses the zero-level (hereinafter referred to as zero cross sampling point) is detected therein, wherein the zero cross sampling point is a point at where an envelope of the re-sampled input signal intersects with level zero of the signal level.

According to the Japanese Patent No. 3428499, a sampling point of which signal level is zero enables to be detected as a zero cross sampling point in case the digital PLL circuit 2 is stably in the lock-state. A zero cross sampling point is actually decided by adjoining two sampling points of which signal polarities are inverted each other.

FIG. 3 exhibits discrete data of a re-sampled input signal that is re-sampled by a time interval T2 based on interpolation phase information, which is outputted from the digitally controlled oscillator 25, when the digital PLL circuit 2 is in the lock-state. In FIG. 3, one sampling point $P_m$ of a plurality of sampling points $P_{m-1}$, $P_m$ and $P_{m+1}$, is allocated at a zero cross sampling point because the time interval T2 is phase-controlled such that the discrete data are allocated to be coincided with a zero cross sampling point. In case of the sampling point $P_m$ shown in FIG. 3, a signal level of the zero cross sampling point $P_m$ is detected as zero by the zero cross detector circuit 232.

FIG. 4 exhibits discrete data of a re-sampled input signal, wherein the time interval T2 is phase-controlled by interpolation phase information, which contains a phase error. In FIG. 4, three sampling points. $P_{n-1}$, $P_n$ and $P_{n+1}$ are allocated in succession. Polarities of discrete data of two successive sampling points $P_n$ and $P_{n+1}$ of the three sampling points $P_{n-1}$, $P_n$ and $P_{n+1}$ invert, wherein the sampling points $P_n$ and $P_{n+1}$ have signal levels $V_n$ and $V_{n+1}$ respectively. In case an absolute value of the signal level $V_n$ of the sampling point $P_n$ is smaller than an absolute value of the signal level $V_{n+1}$ of the sampling point $P_{n+1}$, the sampling point $P_n$ is assumed as a zero cross sampling point.

FIG. 5 shows discrete data of a re-sampled input signal, wherein the re-sampled input signal contains large phase fluctuation components and phase error. In FIG. 5, a point $P_{qz}$ shown by a triangle mark is an intermediate point of two sampling points $P_q$ and $P_{q+1}$ of which polarities of signal level differ from each other. It should be understood that a time interval between the intermediate point $P_{qz}$ and the two sampling points $P_q$ and $P_{q+1}$ is a half of the time interval T2. The intermediate point $P_{qz}$ is assumed as a zero cross sampling point.

In the case of the method of obtaining a zero cross sampling point shown in FIG. 4, it is hardly decided that either one of adjoining two sampling points of which signal polarities alter is a zero cross sampling point unless absolute values of signal level of the two sampling points are compared with each other.

On the contrary, in the case of the method shown in FIG. 5, a zero cross sampling point enables to be obtained by just calculating an intermediate value of respective values of adjoining two sampling points. Consequently, the method shown in FIG. 5 is preferable for detecting phase fluctuation information in a short time period.

Referring back to FIG. 2, in the phase difference detector circuit 233, a timing point of a zero cross sampling point obtained as mentioned above is compared with another timing point of interpolation phase information that is in relation of an oscillation frequency of the digitally controlled oscillator 25. Then a phase error signal is produced in proportion to a phase difference that is a difference between the timing points obtained by comparing the timing point of the zero cross sampling point with the other timing point of the interpolation phase information. The phase error signal is supplied to the loop filter 24, wherein a control signal of which low frequency components of a low frequency signal are accumulated and the low frequency signal is boosted is produced on the basis of a loop characteristic of the digital PLL circuit 2.

The phase error signal, which is conducted through the filtering process for the PLL loop characteristic, is inputted into the digitally controlled oscillator 25. The digitally controlled oscillator 25 outputs interpolation phase information in response to the inputted phase error signal.

First Embodiment

Figure 6:
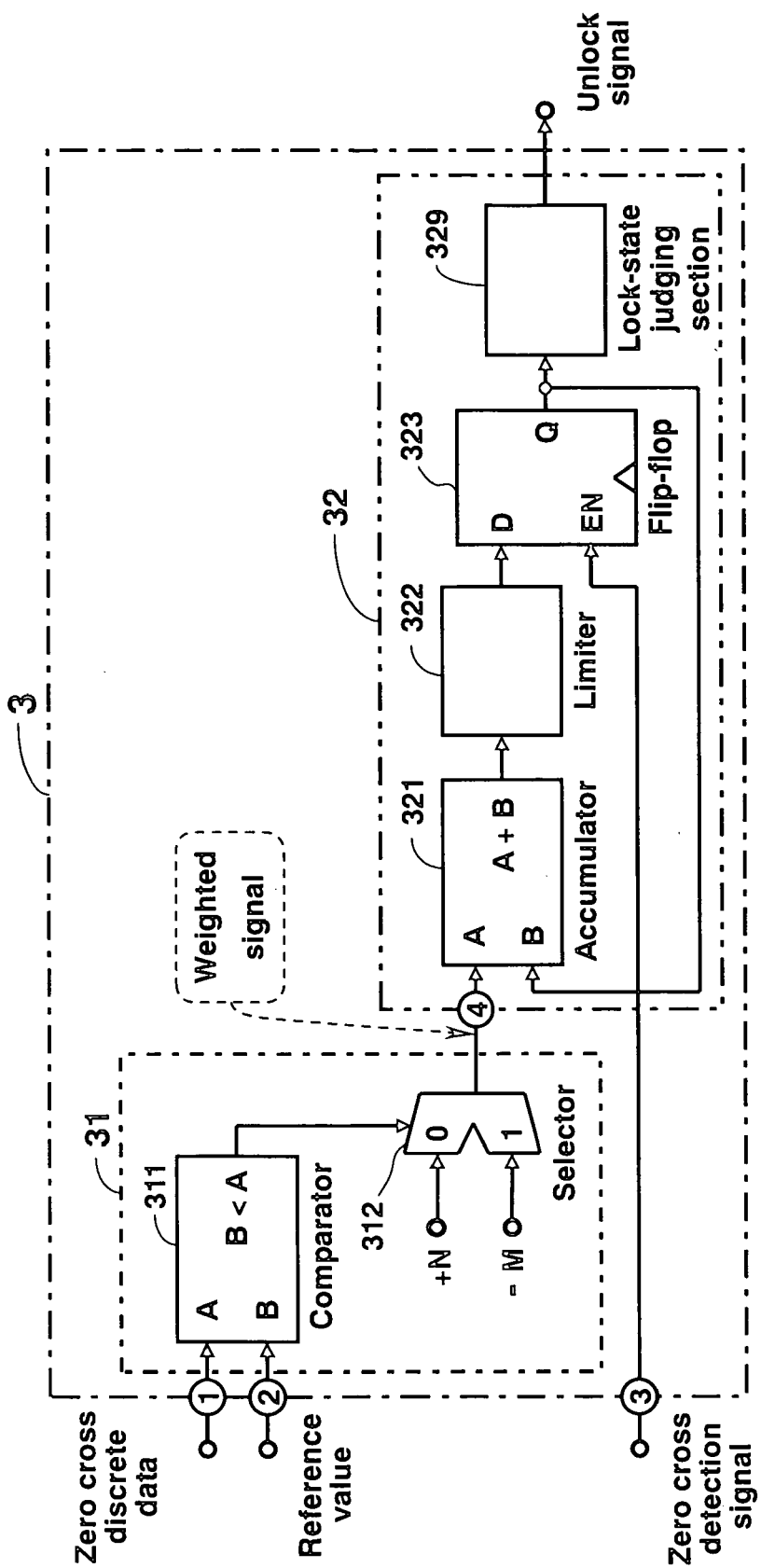
FIG. 6 is a detailed block diagram of the locking-status judging circuit according to a first embodiment of the present invention.

FIG. 6 is a detailed block diagram of the locking-status judging circuit according to a first embodiment of the present invention.

In FIG. 6, the locking-status judging circuit 3 is composed of the weighting allocator section 31 and the lock-state detector section 32. The weighting allocator section 31 is further composed of a comparator 311 and a selector section (hereinafter referred to as selector) 312. The lock-state detector section 32 is further composed of an accumulator 321, a limiter section (hereinafter referred to as limiter) 322, a flip-flop (feedback section) 323, and a lock-state judging section 329.

A phase error signal based on a value of zero cross discrete data at a zero cross sampling point, which is detected by the zero cross detector circuit 232, is inputted into an input terminal "A" of the comparator 311 of the weighing allocator 31. A value of a reference signal (hereinafter referred to as reference value), which is in relation of judging whether the digital PLL circuit 2 is in the lock-state or the unlock-state, is inputted into another input terminal "B" of the comparator 311. These values inputted into the terminals "A" and. "B" are compared in the comparator 311. The comparator 311 outputs a signal "0 (zero)" in case the reference value inputted into the input terminal "A" is larger than the value of the phase error signal. On the contrary, in case the reference value is larger than the value of the phase error signal, the comparator outputs a signal "1 (one)". A result of comparison, that is, the signal "0" or "1" is inputted into the selector 312.

The selector 312 outputs a positive number (hereinafter referred to as weighted signal) "+N" such as +1, for example, as a result of weighting, in case the signal "0" is inputted into the selector 312.

On the contrary, in case the signal "1" is inputted into the selector 312, the selector 312 outputs a negative number (hereinafter referred to as weighted signal) "−M" such as −2, for example, as a result of weighting.

The weighted signal "+N" or "−M" is inputted into an input terminal "A" of the accumulator 321. On the other hand, another input terminal "B" of the accumulator 321 is supplied with a value of an accumulated weighted signal, which is an accumulated value that is obtained by accumulating past weighted signals and outputted from the flip-flop 323. In the accumulator 321, a presently inputted weighted signal is added to the value of the accumulated weighted signal, which is obtained by accumulating a plurality of weighted signals that are inputted in the past, and resulting in obtaining a newly accumulated weighted signal.

In the limiter 322, an absolute value of the newly accumulated weighted signal is limited to be within a range of prescribed upper and lower limits. For example, when an absolute value of the newly accumulated weighted signal exceeds 31, the absolute value of the newly accumulated weighted signal is limited to 31.

The newly accumulated weighted signal of which absolute value is within the limited range is inputted into an input terminal "D" of the flip-flop 323. An enable terminal "EN" of the flip-flop 323 is supplied with an enabling signal, that is, a zero cross detection signal supplied from the zero cross detector circuit 232. When the enabling signal is supplied to the enable terminal "EN", a signal inputted into the input terminal "D" is outputted from an output terminal "Q" of the flip-flop 323. In other words, the newly accumulated weighted signal is outputted from the output terminal "Q" of the flip-flop 323 at each time when the zero cross detector circuit 232 detects that an input signal contains a zero cross sampling point.

The newly accumulated weighted signal of which value is within the limited range is inputted into the lock-state judging section 329. In the lock-state judging section 329, the digital PLL circuit 2 is judged as lock-state in case a polarity of a value of the newly accumulated weighted signal is positive. On the contrary, in case the polarity is negative, the digital PLL circuit 2 is judged as unlock-state.

Judging whether the digital PLL circuit 2 is in the lock-state or the unlock-state is conducted by a polarity of an accumulated weighted signal. If a range of the accumulated weighted signal is not limited, a value of the accumulated weighted signal enlarges when the digital PLL circuit 2 maintains the lock-state or the unlock-state for a long time. Consequently, limiting a range of the accumulated weighted signal enables to detect change of the locking-status of the digital PLL circuit 2 from the lock-state to the unlock-state and vice versa by smaller number of accumulations.

Further, the lock-state or the unlock-state of the digital PLL circuit 2 enables to be detected accurately. In case the digital PLL circuit 2 transits from the lock-state to the unlock-state and vice versa, the transition enables to be detected in a short time.

Furthermore, signals to be processed in the accumulator 321 and the flip-flop 323 are prevented from overflowing.

In the above descriptions, positive and negative numbers (weighted signals) that are outputted from the selector 312 are assumed as an integer. However, it shall be understood that the positive and negative numbers enable to be a numeric character including a decimal place.

Further, as mentioned above, the lock-state detector section 32 judges the lock-state or the unlock-state on the basis of a polarity of a signal outputted from the limiter 322. However, it shall be understood that the lock-state enables to be judged by a polarity of a signal outputted from the accumulator 321.

Furthermore, it shall be understood that inserting the limiter 322, which is inserted between the accumulator 321 and the flip-flop 323 in FIG. 6, between the output terminal "D" of the flip-flop 323 and the input terminal "B" of the accumulator 321 enables to conduct the same operation.

More, by designating a threshold value, the locking-status of the digital PLL circuit 2 enables to be judged by a signal outputted from the accumulator 321 or the limiter 322 whether or not the signal exceeds the threshold value instead of judging the locking-status by a polarity of an accumulated weighted signal. In this case, by changing a level of the threshold value, detecting either one of the lock-state and the unlock-state enables to be immediately performed.

Moreover, as mentioned above, judging whether the digital PLL circuit 2 is in the lock-state or the unlock-state in the lock-state judging section 329 is conducted by a polarity of an accumulated weighted signal that is outputted from the flip-flop 323. However, it shall be understood that the polarity of an accumulated weighted signal outputted from the flip-flop 323 enables to be inverted.

Second Embodiment

Figure 7:
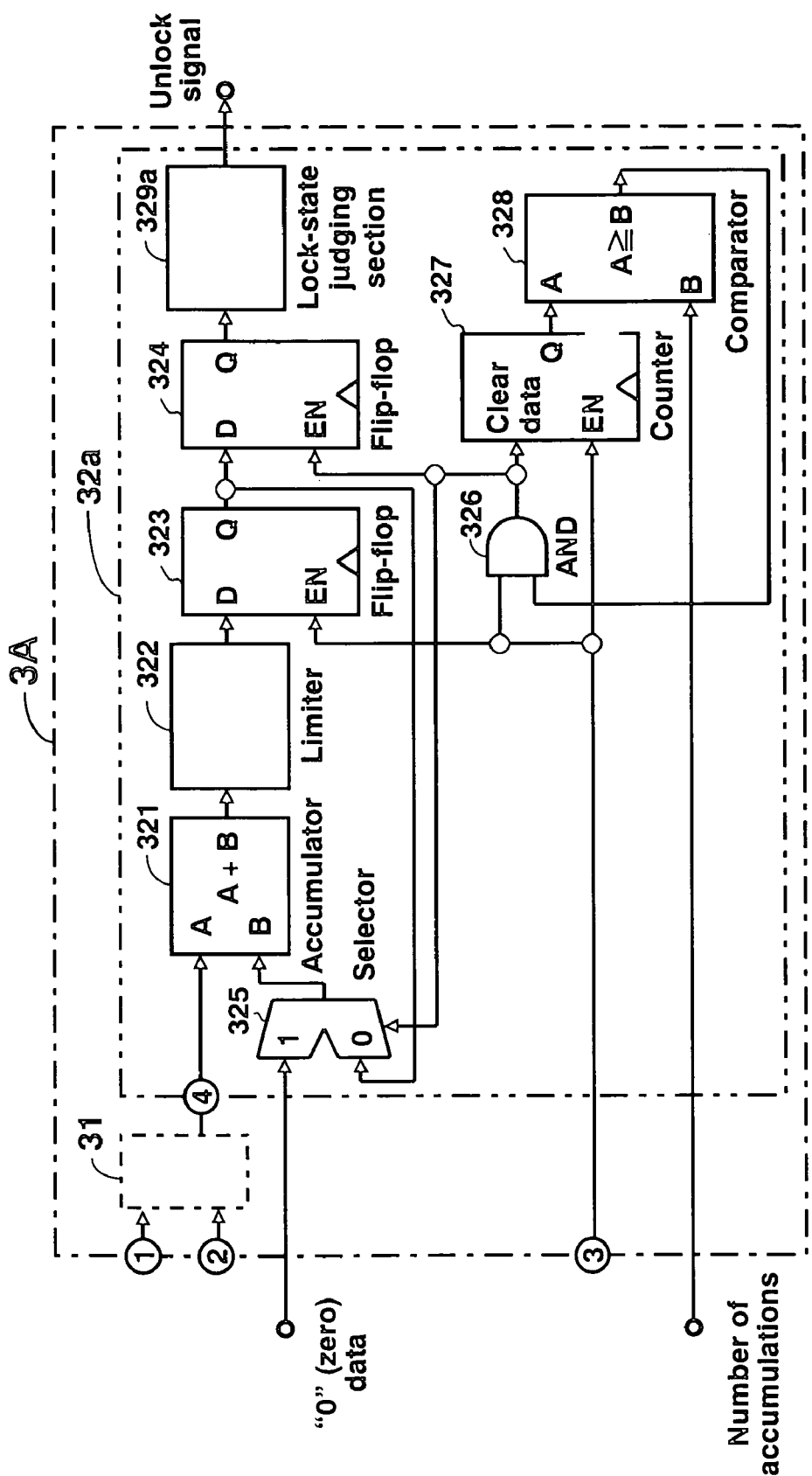
FIG. 7 is a detailed block diagram of another locking-status judging circuit according to a second embodiment of the present invention.

FIG. 7 is a detailed block diagram of another locking-status judging circuit according to a second embodiment of the present invention.

FIGS. 8(a) to 8(f) exhibit operations of the other locking-status judging circuit according to the second embodiment of the present invention.

Figure 9:
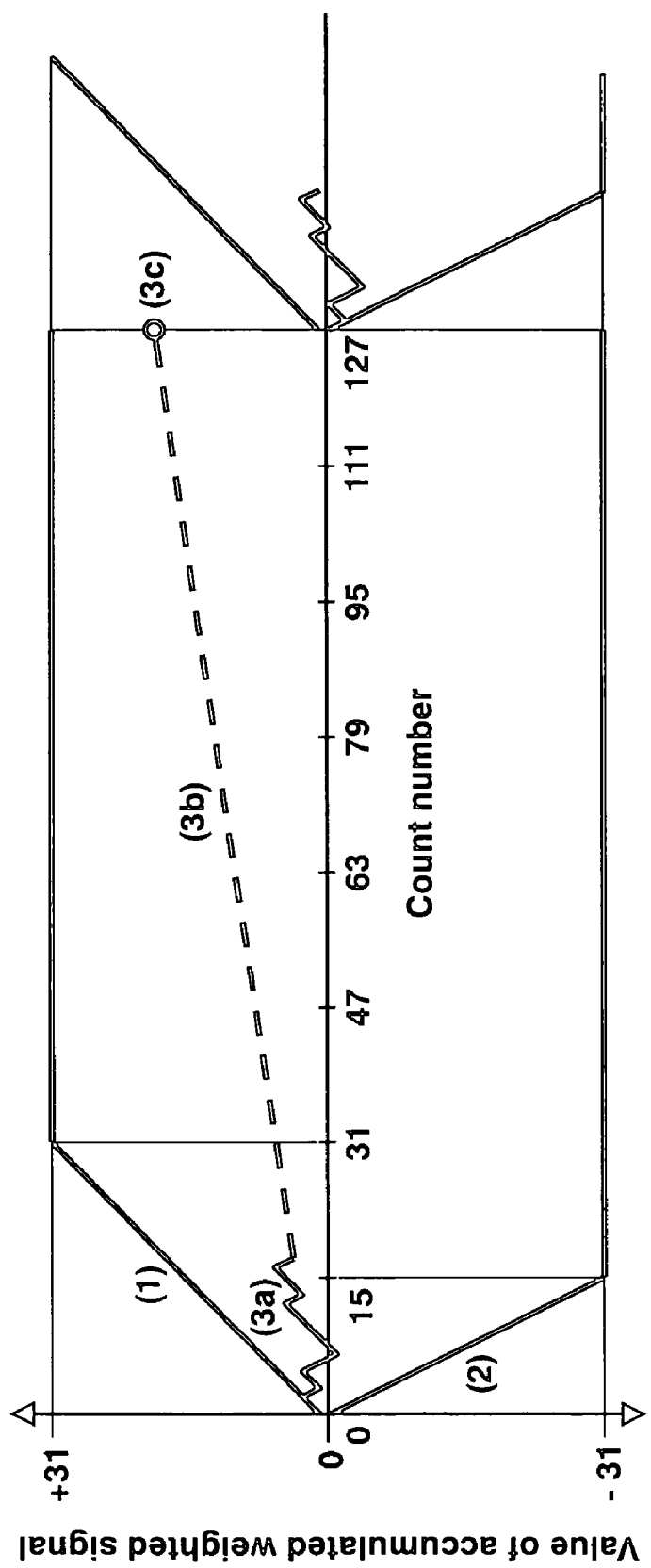
FIG. 9 exhibits change of accumulated weighted signal according to the second embodiment of the present invention.
Figure 10:
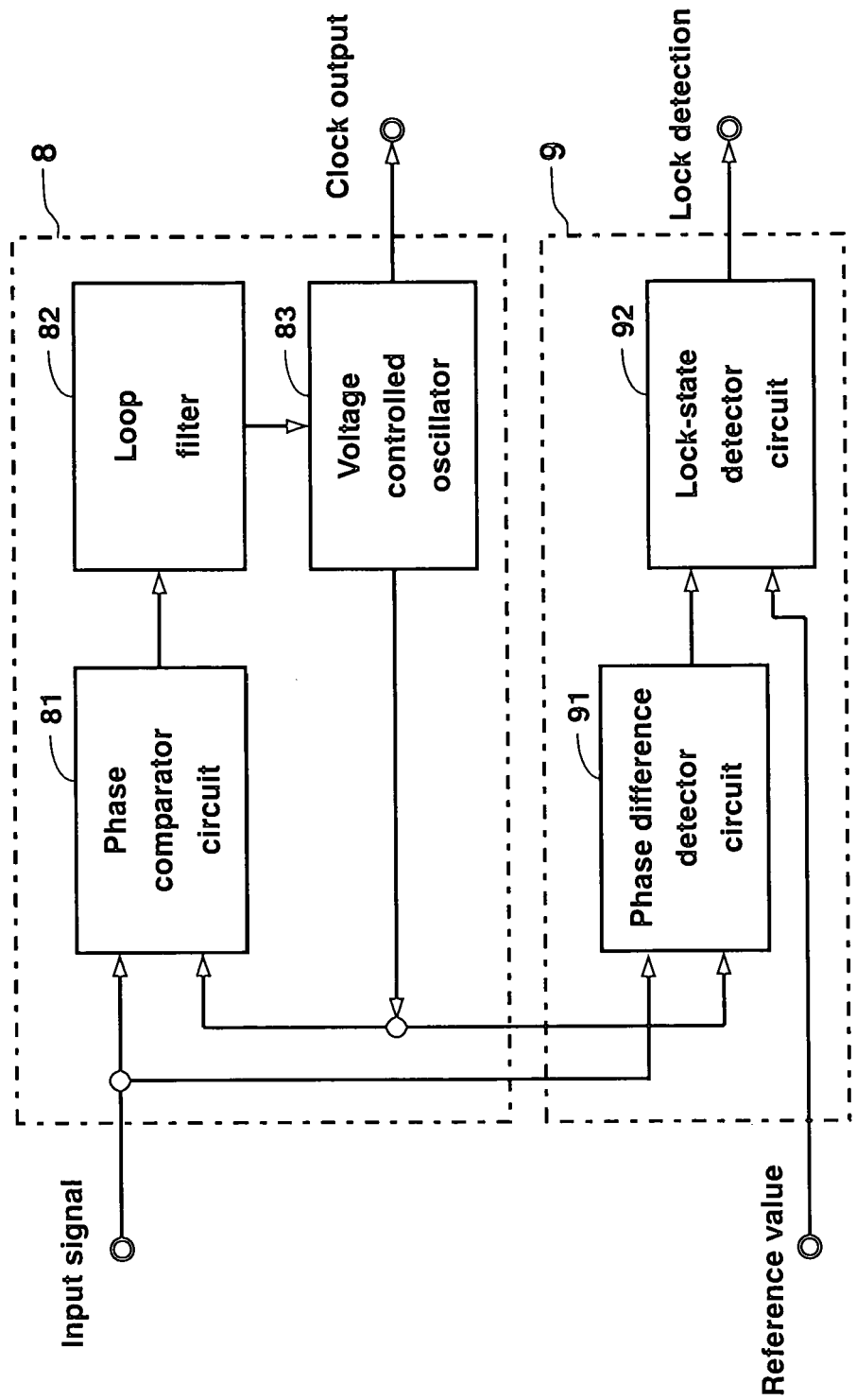
FIG. 10 is a block diagram of a conventional PLL circuit provided with a lock-state detecting section according to the prior art.

FIG. 9 exhibits change of weighted signal for accumulation according to the second embodiment of the present invention.

In FIG. 7, the other locking-status judging circuit 3A is composed of the weighting allocator section 31 and a lock-state detector section 32a. The lock-state detector section 32a is further composed of the accumulator 321, the limiter 322, the flip-flop 323, another flip-flop 324, a selector 325, an AND circuit 326, a counter 327, a comparator 328, and an lock-state judging section 329a.

Another locking-status judging circuit 3A according to a second embodiment of the present invention is identical to the locking-status judging circuit 3 according to the first embodiment of the present invention except for the lock-state detector section 32, so that the same circuitry and the same components are denoted by the same reference numbers and details of their operations and functions are omitted.

The lock-state detector section 32 according to the first embodiment of the present invention is continuously operated to judge the locking-status of the digital PLL circuit 2 on the basis of an weighted signal outputted from the weighting allocator section 31. On the contrary, the lock-state detector section 32a according to the second embodiment of the present invention is operated by initializing an operation of judging the locking-status at every prescribed number of accumulations.

In case that number of accumulations is designated to 128 times (from number zero to number 127), for example, the number 127 is inputted into an input terminal "B" of the comparator 328. The counter 327 increases a count number by one at each time when a zero cross detection signal (enabling signal) from the zero cross detector circuit 232 is inputted into an enable terminal "EN" of the counter 327 through the terminal ③. The comparator 328 compares the count number that is increased by one with the number 127 inputted into the input terminal "B". The comparator 328 outputs a signal "0 (zero)" in case the count number is less than 127, and the counter 327 continues to increase a count number at each time when the zero cross detection signal is inputted into the enable terminal "EN" through the terminal ③. The comparator 328 outputs a signal "1 (one)" when the count number reaches to 127.

The AND circuit 326 outputs a signal "1" when the signal "1" from the comparator 328 and the zero cross detection signal is simultaneously inputted into input terminals of the AND circuit 326.

The signal "1", which is outputted from the AND circuit 326 and inputted into a "clear data" terminal of the counter 327, makes a count number of the counter 327 clear to zero. Then, the counter 327 restarts to count the zero cross detection signal.

Further, the signal "1" outputted from the AND circuit 326 is supplied to a selector 325 and an enable terminal "EN" of the other flip-flop 324 respectively. The other flip-flop 324 outputs an accumulated weighted signal, which is inputted into an input terminal "D" of the other flip-flop 324 immediately before the counter number of the counter 327 is cleared to zero, from an output terminal "Q".

The lock-state judging section 329a judges whether the digital PLL circuit 2 is in the lock-state or the unlock-state in response to a polarity of a signal that is outputted from the output terminal "Q" of the other flip-flop 324, and also conducts lenient judgement for judging a degree of the unlock-state in accordance with a signal level outputted from the output terminal "Q" of the other flip-flop 324.

When a signal to be inputted into the selector 325 from the AND circuit 326 is "0 (zero)", a circuitry constituted by the accumulator 321, the limiter 322, the flip-flop 323 and the selector 325 conducts the same operations as the circuitry constituted by those of the first embodiment of the present invention shown in FIG. 6. In other words, when a signal that is inputted into the selector 325 is "0", the selector 325 selects the accumulated weighted signal outputted from the output terminal "Q" of the flip-flop 323 and the accumulated weighted signal is supplied to the input terminal "B" of the accumulator 321, and resulting in conducting the same operations.

On the contrary, in case a signal that is outputted from the AND circuit 326 and inputted into the selector 325 is "1", the selector 325 selects "0 (zero)" data to be inputted into an input terminal "1" of the selector 325, and the "0" data is inputted into the input terminal "B" of the accumulator 321. The "0" data inputted into the accumulator 321 makes an accumulated weighted signal that is accumulated in the past clear to zero, and then a newly weighted signal, which is inputted into the input terminal "A" of the accumulator 321, is outputted to the limiter 322. Succeedingly, the lock-sate detector 32a is initiated to accumulate weighted signals to be inputted into the input terminal "A" of the accumulator 321 through the terminal ④ the same operation that the lock-state detector section 32 according to the first embodiment does.

With referring to FIGS. 8(a) to 8(f), a signal flow in the lock-state detector section 32a is depicted next.

Figure 8A:
FIGS. 8(a) to 8(f) exhibit operations of the other locking-status judging circuit according to the second embodiment of the present invention.

FIG. 8(a) is a zero cross detection signal that is outputted from the zero cross detector circuit 232 and inputted into the terminal ③ of the locking-status judging circuit 3A. In other words, FIG. 8(a) shows a waveform of a signal for detecting a zero cross sampling point. The lock-state detector section 32a operates in response to change of the zero cross detection signal. The counter 327 counts number of pulses of the zero cross detection signal.

Figure 8B:
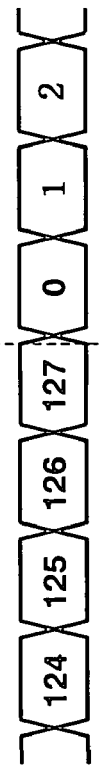
Figure 8C:

FIG. 8(b) is an output signal that is outputted from an output terminal "Q" of the counter 327 and inputted into an input terminal "A" of the comparator 328. FIG. 8(c) is an output signal that is outputted from the comparator 328 when an input signal (count number) inputted into the input terminal "A" of the comparator 328 is equal to or larger than prescribed number of accumulations inputted into an input terminal "B" of the comparator 328.

The comparator 328 detects whether or not the count number exceeds the prescribed number of accumulations. In case the comparator 328 detects that the count number exceeds the prescribed accumulation number 127, the comparator 328 outputs the signal shown in FIG. 8(c).

Figure 8D:
Figure 8E:

FIG. 8(d) shows a series of weighted signals "W" that is sequentially outputted from the selector 312 of the weighing allocator section 31. In FIG. 8(d), a subscript numeral added to the letter "W" denotes a count number to be counted by the counter 327. For example, $W_{127}$ denotes that a weighted signal at the $128^{th}$ weighing, that is, at the count number 127. FIG. 8(e) shows a series of accumulated weighted signals that is outputted from the output terminal "Q" of the flip-flop 323. In FIG. 8(e), $\Sigma_{127}$, for example, denotes an accumulated weighted signal at the count number 127, wherein $\Sigma_{127}$ equals to sum of weighted signals $W_0$ through $W_{127}$, that is, $\Sigma_{127} = W_0 + W_1 + - - - + W_{126} + W_{127}$.

When the signal shown in FIG. 8(c) and the zero cross detection signal shown in FIG. 8(a) is inputted into the input terminals of the AND circuit 326 simultaneously, the AND circuit 326 outputs the signal "1". As mentioned above, the signal "1" initiates the selector 325 to select the "0" data, and the "0" data is inputted into the input terminal "B" of the accumulator 321. The accumulated weighted signal $\Sigma_{127}$ is replaced by the "0" data in the accumulator 321. Consequently, the operation of judging the locking-status is initialized at the count number 127.

Figure 8F:
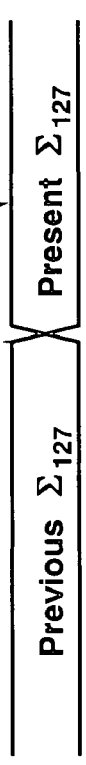

FIG. 8(f) shows an accumulated weighted signal that is outputted from the output terminal "Q" of the flip-flop 324. The accumulated weighted signal $\Sigma_{127}$ at the time when an output from the counter 327 is cleared to zero is outputted as a present $\Sigma_{127}$ shown in FIG. 8(f). The present $\Sigma_{127}$ is maintained until an output from the counter 327 will be cleared to zero in the next time.

With referring to FIG. 9, description is given to an accumulated weighted signal.

FIG. 9 exhibits change of accumulated weighted signal according to the second embodiment of the present invention. In FIG. 9, the x-axis is a count number of the counter 327 and the y-axis is a value of accumulated weighted signal. The counter 327 counts from 0 (zero) to 127 repeatedly, wherein the value of accumulated weighted signal is limited within a range of −31 to +31 by the limiter 322. In FIG. 9, a line (1) denotes a value of an accumulated weighted signal when the digital PLL circuit 2 is in the lock-state. The selector 312 select the signal +N (=1) and an accumulated weighted signal is increased by one at each time the zero cross detection signal is inputted into the enable terminal "EN" of the flip-flop 323. As shown in FIG. 9, a value of the accumulated weighted signal becomes 31 when the count number is 31, and then the value is limited to 31 on and after the count number 31.

Another line (2) denotes a value of an accumulated weighted signal when the digital PLL circuit 2 is in the unlock-state. The selector 312 select the signal −N (=−2) and an accumulated weighted signal is decreased by two at each time the zero cross detection signal is inputted into the enable terminal "EN" of the flip-flop 323. As shown in FIG. 9, a value of the accumulated weighted signal is limited to −31 on and after the count number 15.

A polygonal line (3a) denotes change of an accumulated weighted signal when the digital PLL circuit 2 is in the lock-state and the unlock-state alternately. A gradient of the change of an accumulated weighted signal during the lock-state is in parallel with that of the first part of the line (1).

Further, a gradient of the change of an accumulated weighted signal during the unlock-state is in parallel with that of the first part of the other line (2). The polygonal line (3a) continues until the count number 127, wherein a broken line (3b) is extension of the polygonal line (3a). A reference number (3c) denotes a value of an accumulated weighted signal at the count number 127. The value (3c) is outputted from the output terminal "Q" of the other flip-flop 324.

The lock-state judging section 329a judges leniently the locking-status of the digital PLL circuit 2 by using a value of an accumulated weighted signal outputted from the other flip-flop 324 as well as judging in accordance with a polarity of the value of the accumulated weighted signal in comparison with the lock-state judging section 329 according to the first embodiment shown in FIG. 6. By clearing a value of an accumulated weighted signal to zero at each time when number of accumulations reaches the prescribed accumulation number, the judgement is hardly affected by an accumulated weighted signal that is accumulated in past times. Consequently, judging the locking-status of the digital PLL circuit 2 is conducted in accordance with a value of an accumulated weighted signal. In other words, judging the locking-status of the digital PLL circuit 2 is conducted in accordance with frequency of the unlock-state.

The lock-state judging section 329a enables to obtain a value of an accumulated weighted signal as a result of judgement in accordance with frequency of the unlock-state. On the basis of the obtained result of judgement, it is appropriately conducted that response speed of the digital PLL circuit 2 to lock on an input signal enables to be accelerated by increasing loop gain of the digital PLL circuit 2 during the unlock-state. On the contrary, during the lock-state, it is also conducted appropriately that operational parameters to obtain a clock signal having a stable frequency even for noise signal components to be inputted enable to be designated by reducing the loop gain of the digital PLL circuit 2 in accordance with the locking-status of the digital PLL circuit 2.

As mentioned above, according to the present invention, a judging method of the locking-status is realized by differing a weighing index for the lock-state from that for the unlock-state in comparison with the conventional lock-state detecting method according to the prior art. Consequently, a time period of detecting change of the locking-status of a digital PLL circuit from the lock-state to the unlock-state and vice versa enables to be designated independently.

Further, an unlock signal to be outputted from the locking-status judging circuit in response to the locking-status of a digital PLL circuit enables to be utilized for controlling reproduction of an optical disc such as holding an operation of an adaptive equalizing circuit while demodulating a reproduced information signal and directing a demodulator circuit to interpolate a demodulated information signal.

Furthermore, in case two successive sampling points of an input signal containing excessive phase error depart from the level zero (zero cross), wherein the zero cross lays between the two successive sampling points, an intermediate point of the two successive sampling points is interpolated and assumed as a zero cross sampling point, and then phase synchronization is continued. In this case, sensitivity of detecting the unlock-state of a digital PLL circuit enables to be improved in case a phase error signal is obtained by using discrete data of either one of the two successive sampling points, which is more apart from the zero cross.

The locking-status judging circuit according to the present invention enables to judge whether a digital PLL circuit is in the lock-state or the unlock-state immediately as well as judging correctly, wherein the digital PLL circuit generates an oscillator output signal having a frequency of which phase is synchronized with an input signal that is randomly mixed with a signal, which contains phase error components in high level and is short in inversion interval, and another signal, which is long in inversion interval and small in phase error component.

Further, in case an absolute value of the positive number (+N) outputted from the selector 312 is designated to be smaller than an absolute value of the negative number (−M), the locking-status judging circuit according to the present invention enables to judge the unlock-state more promptly even after a digital PLL circuit maintains the lock-state for a long period.

Furthermore, the locking-status judging circuit according to the present invention enables to judge whether a digital PLL circuit generates a clock signal to activate a decoding circuit for an input signal normally or not when demodulating the input signal although the input signal contains noise and phase fluctuation components excessively.

In addition thereto, the result of judgement enables to be utilized for controlling the decoding circuit.

While the invention has been described above with reference to a specific embodiment thereof, it is apparent that many changes, modifications and variations in configuration, materials and the arrangement of equipment and devices can be made without departing form the invention concept disclosed herein.

Further, it will be apparent to those skilled in the art that various modifications and variations could be made in the present invention without departing from the scope of the invention.

What is claimed is:

1. A locking-status judging circuit for a digital PLL circuit, judging whether or not the digital PLL circuit locks on an input signal, comprising:
    a comparator for comparing a phase error signal outputted from the digital PLL circuit with a reference signal to be utilized for judging whether or not the digital PLL circuit locks on an input signal, and for outputting a signal "0 (zero)" in case the reference signal is larger than the phase error signal or a signal "1 (one)" in case the reference signal is smaller than the phase error signal;
    a selector section for outputting a positive number in case the signal "0" is inputted or a negative number in case the signal "1" is inputted;
    a limiter section for limiting an accumulated positive or negative number to be within a range of a prescribed upper limit and a prescribed lower limit;
    a feedback section for returning the accumulated positive or negative number within the range of the prescribed upper limit and the prescribed lower limit;
    an accumulator for adding the accumulated positive or negative number, returned from the feedback section, and either the positive number or the negative number, outputted from the selector section, and for outputting a newly accumulated number obtained by adding the accumulated positive or negative number and either the positive number or the negative number; and a lock-state judging section for judging the digital PLL circuit as a lock-state in case an accumulated value of the newly accumulated number is positive, or as an unlock-state in case the accumulated value of the newly accumulated number is negative.

2. The locking-status judging circuit for a digital PLL circuit as claimed in claim 1, wherein an absolute value of the positive number outputted from the selector section is smaller than an absolute value of the negative number.

* * * * *